US007704759B2

United States Patent
Takayama et al.

(10) Patent No.: US 7,704,759 B2
(45) Date of Patent: Apr. 27, 2010

(54) SEMICONDUCTOR LASER DEVICE AND METHOD FOR FABRICATING THE SAME

(75) Inventors: Toru Takayama, Nara (JP); Satoshi Murasawa, Hyogo (JP); Yasuhiro Fujimoto, Okayama (JP); Hisashi Nakayama, Hyogo (JP); Isao Kidoguchi, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/208,833

(22) Filed: Sep. 11, 2008

(65) Prior Publication Data

US 2009/0017570 A1 Jan. 15, 2009

Related U.S. Application Data

(62) Division of application No. 11/510,638, filed on Aug. 28, 2006, now Pat. No. 7,433,380.

(30) Foreign Application Priority Data

Dec. 28, 2005  (JP) .............................. 2005-377444
Mar. 24, 2006  (JP) .............................. 2006-083068

(51) Int. Cl.
*H01L 21/00* (2006.01)
(52) U.S. Cl. .............................. 438/22; 438/28; 438/34; 438/39; 257/89; 257/E33.001
(58) Field of Classification Search ................ 438/22, 438/28, 34, 39; 257/89, 80, E33.001
See application file for complete search history.

(56) References Cited

U.S. PATENT DOCUMENTS

| 4,817,106 A | 3/1989 | Thompson |
| 4,890,293 A | 12/1989 | Taneya et al. |
| 5,084,893 A | 1/1992 | Sekii et al. |
| 6,058,124 A | 5/2000 | Sun et al. |
| 6,546,035 B2 | 4/2003 | Imafuji et al. |
| 2005/0008054 A1* | 1/2005 | Ukai ........................... 372/43 |
| 2005/0271108 A1* | 12/2005 | Wada et al. .............. 372/50.12 |

FOREIGN PATENT DOCUMENTS

JP    11-186651 A    7/1999

* cited by examiner

*Primary Examiner*—Hsien-ming Lee
(74) *Attorney, Agent, or Firm*—McDermott Will & Emery LLP

(57) ABSTRACT

In a semiconductor laser device, a plurality of light-emitting elements emitting light with different wavelengths are integrated on a substrate. Each of the light-emitting elements includes, on the substrate, an active layer and cladding layers respectively provided on top and bottom of the active layer. One of the cladding layers provided on top of the active layer is an upper cladding layer having a mesa ridge portion. An etching stopper layer for forming the ridge portion is interposed between the ridge portion and the other portion of the upper cladding layer. The thickness of the etching stopper layer varies among the light-emitting elements.

2 Claims, 11 Drawing Sheets

SEMICONDUCTOR LASER DEVICE AND METHOD FOR FABRICATING THE SAME

RELATED APPLICATIONS

This application is a Divisional of U.S. application No. 11/510,638, filed on Aug. 28, 2006, now U.S. Pat. No. 7,433,380, which claims priority of Japanese Application No. 2005-377444, filed Dec. 28, 2005 and Japanese Application No. 2006-083068, filed Mar. 24, 2006, the entire contents of each of which are hereby incorporated by reference.

BACKGROUND OF THE INVENTION

The present invention relates to semiconductor laser devices for use as light sources for pickups in optical disk apparatus or light sources necessary for, for example, other electronic devices and information processors. The present invention particularly relates to semiconductor laser devices having two or more emission wavelengths in red and infrared light regions, for example.

High-capacity digital video disks (DVDs) capable of high-density recording and DVD apparatus for playing back such DVDs are currently on the market and have received attention as products expected to further grow in demand. Since these DVDs are high-density recording media, AlGaInP-based semiconductor lasers having an emission wavelength of 650 nm are used as laser light sources for recording and playback of the DVDs. Accordingly, optical pickups in conventional DVD apparatus could not play back compact discs (CDs) and MiniDiscs (MDs) that are played back using AlGaAs-based semiconductor lasers having an emission wavelength of 780 nm.

To solve this problem, an optical pickup formed by incorporating laser chips in separate packages, specifically, an optical pickup provided with an AlGaInP-based semiconductor laser having an emission wavelength in a 650-nm region and an AlGaAs-based semiconductor laser having an emission wavelength in a 780-nm region is adopted. However, since such an optical pickup includes two packages of the AlGaInP-based semiconductor laser and the AlGaAs-based semiconductor laser, the problem of increase in size and, moreover, the problem of increase in size of DVD apparatus arise. To solve these problems, an integrated semiconductor light-emitting device including a plurality of types of semiconductor light-emitting element with different emission wavelengths having light-emitting structures made of semiconductor layers grown on the same substrate are proposed (in Japanese Unexamined Patent Publication No. 11-186651).

FIG. 9 illustrates a structure of the conventional integrated semiconductor light-emitting device described above. As illustrated in FIG. 9, in this conventional integrated semiconductor light-emitting device (laser device), an AlGaAs-based semiconductor laser LD1 with an emission wavelength in a 700-nm region (e.g., 780 nm) and an AlGaInP-based semiconductor laser LD2 with an emission wavelength in a 600-nm region (e.g., 650 nm) are integrated on an n-type GaAs substrate 201. These lasers LD1 and LD2 are separated from each other on the substrate 201. The n-type GaAs substrate 201 is, for example, a (100) orientated substrate or a substrate whose principal plane is oriented, for example, 5 to 15 degrees off from the (100) plane.

In the AlGaAs-based semiconductor laser LD1, an n-type GaAs buffer layer 211, an n-type AlGaAs cladding layer 212, an active layer 213 with a single quantum well (SQW) structure or a multiple quantum well (MQW) structure, a p-type AlGaAs cladding layer 214 and a p-type GaAs cap layer 215 are stacked on the n-type GaAs substrate 201. An upper portion (i.e., ridge portion) of the p-type AlGaAs cladding layer 214 and the p-type GaAs cap layer 215 form a stripe extending in one direction. An n-type GaAs current confinement layer 216 is provided on both sides of the stripe, thereby forming a current confinement structure. A p-side electrode 217 is provided on the stripe p-type GaAs cap layer 215 and the n-type GaAs current confinement layer 216 and is in Ohmic contact with the p-type GaAs cap layer 215. The p-side electrode 217 is, for example, a Ti/Pt/Au electrode.

In the AlGaInP-based semiconductor laser LD2, an n-type GaAs buffer layer 221, an n-type AlGaInP cladding layer 222, an active layer 223 with an SQW structure or an MQW structure, a p-type AlGaInP cladding layer 224, a p-type GaInP intermediate layer 225 and a p-type GaAs cap layer 226 are stacked on the n-type GaAs substrate 201. An upper portion (i.e., ridge portion) of the p-type AlGaInP cladding layer 224, the p-type GaInP intermediate layer 225 and the p-type GaAs cap layer 226 form a stripe extending in one direction. An n-type GaAs current confinement layer 227 is provided on both sides of the stripe, thereby forming a current confinement structure. A p-side electrode 228 is provided on the stripe p-type GaAs cap layer 226 and the n-type GaAs current confinement layer 227 and is in Ohmic contact with the p-type GaAs cap layer 226. The p-side electrode 228 is, for example, a Ti/Pt/Au electrode.

An n-side electrode 229 is provided on the back surface of the n-type GaAs substrate 201 and is in Ohmic contact with the n-type GaAs substrate 201. The n-side electrode 229 is, for example, an AuGe/Ni electrode or an In electrode.

In this conventional device, the p-side electrode 217 of the AlGaAs-based semiconductor laser LD1 and the p-side electrode 228 of the AlGaInP-based semiconductor laser LD2 are soldered to respective heat sinks H1 and H2 which are electrically separated from each other on a package base 300.

In the conventional integrated semiconductor laser device configured as described above, the AlGaAs-based semiconductor laser LD1 is driven by causing current to flow between the p-side electrode 217 and the n-side electrode 229, whereas the AlGaInP-based semiconductor laser LD2 is driven by causing current to flow between the p-side electrode 228 and the n-side electrode 229. Laser light with a wavelength in a 700-nm region (e.g., 780 nm) is obtained by driving the AlGaAs-based semiconductor laser LD1, whereas laser light with a wavelength in a 600-nm region (e.g., 650 nm) is obtained by driving the AlGaInP-based semiconductor laser LD2. Selection between driving of the AlGaAs-based semiconductor laser LD1 and driving the AlGaInP-based semiconductor laser LD2 is performed by, for example, operating an external switch.

As described above, in the conventional integrated semiconductor laser device, the AlGaAs-based semiconductor laser LD1 with an emission wavelength in a 700-nm region and the AlGaInP-based semiconductor laser LD2 with an emission wavelength in a 600-nm region allow laser light for DVDs and laser light for CDs and MDs to be obtained independently of each other. Accordingly, if this integrated semiconductor laser device is mounted as a laser light source on an optical pickup of DVD apparatus, playback or recording for one of DVDs, CDs and MDs is enabled. The laser structures of the AlGaAs-based semiconductor laser LD1 and the AlGaInP-based semiconductor laser LD2 are formed by semiconductor layers grown on the same n-type GaAs substrate 201, so that one package is sufficient for the integrated semiconductor laser device. As a result, the size of the optical pickup is reduced, thus miniaturizing DVD apparatus.

When a semiconductor laser is used as a light source of an optical disk system, laser light focused on an optical disk is reflected off the surface thereof and is fed back to the laser emission edge again. In this case, the optical disk serves as a complex resonator. The oscillation wavelength in a longitudinal mode determined depending on the complex resonator and the oscillation wavelength in a longitudinal mode determined depending on the resonator plane of the semiconductor laser itself differ from each other because these resonators have different optical path lengths. In addition, the effective end-facet reflectance due to complex resonator effects also varies. Accordingly, in one operation state, the oscillation threshold current value in the longitudinal mode determined depending on the complex resonator is smaller than that determined depending on the laser itself. As a result, the oscillation modes are replaced with each other in some cases. In such cases, reflected feedback light from the optical disk causes mode competition of the longitudinal modes, so that the optical output becomes unstable, resulting in occurrence of noise. This noise is referred to as optical feedback noise. When the level of this noise exceeds $-120$ dB/Hz in terms of relative intensity noise (RIN), actual operation is hindered.

To reduce the optical feedback noise in a semiconductor laser, multi-longitudinal-mode operation of the semiconductor laser is effective. The multi-longitudinal-mode operation is a laser oscillation state in which the wavelength (oscillation wavelength) at which laser oscillation occurs is not a single wavelength but is composed of a plurality of oscillation wavelengths. In the multi-longitudinal-mode operation of the semiconductor laser, mode competition is less likely to occur and excessive noise does not occur, so that a low-noise characteristic with a small influence of reflected feedback light from an optical disk is implemented.

To generate multimode oscillation, it is sufficient to perform pulse operation of a semiconductor laser. The pulse operation of the semiconductor laser is achieved by performing pulse driving of the laser using a high-frequency superimposing circuit. However, in this case, the problem of necessity of a new driving circuit and, in addition, the problem of a malfunction of another electronic device caused by a radio wave leaking from the high-frequency superimposing circuit arise.

To perform pulse driving of a semiconductor laser without a high-frequency superimposing circuit, it is effective to utilize a self-oscillation phenomenon in the semiconductor laser. In the self-oscillating laser, an absorption region formed in a waveguide to laser light is excited by the laser light itself, and the amount of light absorption decreases, resulting in that a saturable absorber to be transparent (absorption saturation) needs to be formed. When the absorber becomes transparent, the loss in the waveguide decreases and light power rapidly increases. When the light power increases, the number of carriers in the active layer consumed during induced emission increases and the carriers are rapidly lost, resulting in that a shortage of the number of carriers occurs and laser oscillation stops. In view of this, the light power of the self-oscillating laser performs pulse operation with time even under DC bias operation, thus obtaining multi-longitudinal-mode oscillation. In the semiconductor laser under self-oscillating operation, the carrier density in the active layer varies with time, and thus the refractive index of the active layer varies with time. The variation in refractive index of the active layer causes a variation of the emission wavelength, so that the line width of each oscillation spectrum increases. As a result, coherence with reflected feedback light from an optical disk is reduced.

As described above, a self-oscillating laser is important as a small low-noise light source capable of reducing excessive noise without using a high-frequency superimposing circuit, and application of this self-oscillating laser to the integrated semiconductor laser device (two-wavelength semiconductor laser device) described above is desired.

SUMMARY OF THE INVENTION

To apply a self-oscillating laser to a car-mounted optical disk system such as a car navigation system, the self-oscillating laser needs to sufficiently operate even under high temperatures, e.g., about 85° C. As described above, in the self-oscillating laser, it is necessary to form a saturable absorber in a waveguide. However, formation of a saturable absorber leads to an increase of a waveguide loss. Thus, if the volume of the saturable absorber is too large, the operation current value increases, so that heat saturation of the light power occurs in the high-temperature operation at, for example, 85° C. or higher. As a result, a light power of 5 mW, which is necessary for playback of an optical disk, is not obtained. On the other hand, if the volume of the saturable absorber is small, the operation current value is small but no self-oscillation occurs. That is, the volume of the saturable absorber has an appropriate value. Hereinafter, specific description will be given.

A saturable absorber is generally formed in an active layer. In this case, light distribution of guided light propagating in a waveguide is laterally extended to an active layer formed under a current blocking layer so that the saturable absorber is formed in the active layer. This active layer region initially serves as an absorber to laser light. However, as a result of electron-hole pair generation in the active layer due to excitation by the laser light itself, light absorption is reduced. The reduction of light absorption reduces a waveguide loss, so that light power increases and excitation of the electron-hole pairs are promoted in the active layer region. Accordingly, the light absorption is further reduced and, consequently, the saturable absorber becomes transparent to laser light. As a result, light power rapidly increases. That is, light power pulses and increases. When light power increases in this manner, the excited electron-hole pairs are lost by recombination due to induced emission, so that the active layer region in which the saturable absorber is formed functions as an absorber again. As a result, self-oscillation in which light power pulses and vibrates with time is obtained.

In a structure in which a saturable absorber is formed in an active layer, if light distribution is excessively extended in the horizontal/lateral direction, the volume of the saturable absorber increases and a waveguide loss increases, thus leading to an increase of the operation current value and heat saturation of light power during high-temperature operation. On the other hand, if extension of light distribution in the horizontal/lateral direction is small so as to reduce the operation current value, the volume of the saturable absorber decreases, so that no self-oscillation is obtained. As a result, a low-noise characteristic is impaired. In this manner, to obtain a self-oscillating laser capable of operating at high temperatures, it is necessary to appropriately set the volume of a saturable absorber. To achieve this, the shape of light distribution needs to be precisely set. The shape of light distribution is controlled by the stripe width (W) for current injection and the effective refractive index difference ($\Delta N$) between the inside and outside of the current injection stripe.

To fabricate a self-oscillating laser with high reproducibility, it is necessary to control the effective refractive index difference between the inside and outside of a current injection stripe (where the effective refractive index difference ΔN is the difference between the effective refractive index of a ridge and the effective refractive index of a current blocking layer on the side of the ridge) on the order of $1 \times 10^{-4}$. The difference ΔN is controlled by the distance (dp) between the current blocking layer and the active layer. To control ΔN on the order of $1 \times 10^{-4}$, dp needs to be controlled with a precision of several tens of Å.

However, in a conventional laser structure as illustrated in FIG. 9, dp is controlled by an etching time in formation of a ridge, so that it is extremely difficult to control dp to a desired value with a precision of several tens of Å as intended.

It is therefore an object of the present invention to provide a multiple-wavelength semiconductor laser device formed on one substrate in which a low-noise laser generating self-oscillation without heat saturation of light power even during operation at, for example, 85° C. or more is applicable to each of a red laser for DVDs and an infrared laser for CD-Rs, for example.

To achieve the object described above, a first semiconductor laser device according to the present invention includes: a substrate; and a plurality of light-emitting elements emitting light with different wavelengths and integrated on the substrate. Each of the light-emitting elements includes, on the substrate, an active layer and cladding layers respectively provided on top and bottom of the active layer, one of the cladding layers provided on top of the active layer is an upper cladding layer having a mesa ridge portion, an etching stopper layer for forming the ridge portion is interposed between the ridge portion and the other portion of the upper cladding layer, and the thickness of the etching stopper layer varies among the light-emitting elements.

In the first semiconductor laser device of the present invention, the thickness of the etching stopper layer for forming the ridge portion of the upper cladding layer varies among the light-emitting elements, so that dp (i.e., the distance between the lower surface of the current blocking layer formed on the sides of the ridge portion and the upper surface of the active layer) is controlled with a high precision of several tens of Å in each of the light-emitting elements. Accordingly, ΔN (i.e., the effective refractive index difference between the inside and outside of the current injection stripe) is controlled on the order of $1 \times 10^{-4}$, so that the shape of light distribution is precisely set. That is, the volume of a saturable absorber formed in the active layer is appropriately set with increase of the operation current value due to increase in vertical divergence angle of light distribution and heat saturation of light power during high-temperature operation prevented. As a result, low-noise lasers with a plurality of wavelengths producing self-oscillation are achieved with high reproducibility.

Preferably, in the first semiconductor laser device of the present invention, the light-emitting elements include: a first light-emitting element emitting light with a relatively short first wavelength; and a second light-emitting element emitting light with a relatively long second wavelength, and the etching stopper layer in the second light-emitting element has a thickness larger than that of the etching stopper layer in the first light-emitting element.

Then, in addition to the advantages described above, the following advantages are obtained. That is, power concentration due to the excessively large thickness of the etching stopper layer and the associated melt fracture (catastrophic optical damage: COD) on the laser facet are prevented, thus preventing decrease of light power. In this case, the first light-emitting element may include an AlGaInP-based active layer containing InGaP, and the second light-emitting element may include an AlGaAs-based active layer containing GaAs. Then, low-noise self-oscillating lasers with two wavelengths in infrared and red regions are allowed to be obtained with high reproducibility without increase in vertical divergence angle of light distribution.

In the first semiconductor laser device of the present invention, the etching stopper layer is preferably made of InGaP.

Then, the foregoing advantages are ensured.

In the first semiconductor laser device of the present invention, the etching stopper layer preferably has a multiple quantum well structure.

Then, in addition to the advantages described above, the following advantages are obtained. That is, it is possible to prevent dissipation of current flowing through the etching stopper layer, i.e., increase of reactive current.

A second semiconductor laser device according to the present invention includes: a substrate; and a plurality of light-emitting elements emitting light with different wavelengths and integrated on the substrate. Each of the light-emitting elements includes, on the substrate, an active layer and cladding layers respectively provided on top and bottom of the active layer, one of the cladding layers provided on top of the active layer is an upper cladding layer having a mesa ridge portion, and the thickness of the portion of the upper cladding layer except for the ridge portion varies among the light-emitting elements.

In the second semiconductor laser device of the present invention, the portion of the upper cladding layer except for the ridge portion varies among the light-emitting elements. Accordingly, ΔN (i.e., the effective refractive index difference between the inside and outside of a current injection stripe) which varies depending on the wavelength of each of the light-emitting elements emitting light with different wavelengths are allowed to be set, so that the shape of light distribution is precisely set. That is, the volume of a saturable absorber formed in the active layer is appropriately set with increase of the operation current value due to increase in vertical divergence angle of light distribution and heat saturation of light power during high-temperature operation prevented. As a result, low-noise lasers with a plurality of wavelengths producing self-oscillation are achieved with high reproducibility.

Preferably, in the second semiconductor laser device of the present invention, the light-emitting elements include: a first light-emitting element emitting light with a relatively short first wavelength; and a second light-emitting element emitting light with a relatively long second wavelength, and the portion of the upper cladding layer except for the ridge portion in the second light-emitting element has a thickness larger than that of the portion of the upper cladding layer except for the ridge portion in the first light-emitting element.

Then, the second light-emitting element is allowed to produce self-oscillation at higher temperatures and the first light-emitting element is allowed to oscillate without thermal runaway at higher temperatures. Accordingly, low-noise lasers with a plurality of wavelengths producing self-oscillation are achieved with high reproducibility. In this case, the first light-emitting element may include an AlGaInP-based active layer containing InGaP, and the second light-emitting element may include an AlGaAs-based active layer containing GaAs. Then, each of the light-emitting elements emitting light with different wavelengths has an appropriate layer structure depending on its wavelength, so that low-noise self-oscillating lasers with a plurality of wavelengths (specifically, two wavelengths in infrared and red regions) are allowed to be obtained with high reproducibility.

A third semiconductor laser device according to the present invention includes: a substrate; and a plurality of light-emitting elements emitting light with different wavelengths and integrated on the substrate. Each of the light-emitting elements includes, on the substrate, an active layer and cladding layers respectively provided on top and bottom of the active layer, one of the cladding layers provided on top of the active layer is an upper cladding layer having a mesa ridge portion, and the height of the ridge portion varies among the light-emitting elements.

In the third semiconductor laser device of the present invention, even if the third semiconductor laser device has a structure similar to those of the first and second semiconductor laser devices, the distance from the upper end of the ridge portion of the upper cladding layer to the upper surface of the active layer are allowed to be set at the same value for the light-emitting elements emitting light with different wavelengths. Accordingly, the heights of the light emission point of the light-emitting elements are allowed to be set at the same level.

Preferably, in the third semiconductor laser device of the present invention, the light-emitting elements include: a first light-emitting element emitting light with a relatively short first wavelength; and a second light-emitting element emitting light with a relatively long second wavelength, and the ridge portion in the first light-emitting element is higher than the ridge portion in the second light-emitting element. Then, the foregoing advantages are ensured. In this case, the first light-emitting element may include an AlGaInP-based active layer containing InGaP, and the second light-emitting element may include an AlGaAs-based active layer containing GaAs. Then, each of the light-emitting elements emitting light with different wavelengths has an appropriate layer structure depending on its wavelength, so that low-noise self-oscillating lasers with a plurality of wavelengths (specifically, two wavelengths in infrared and red regions) are allowed to be obtained with high reproducibility.

A fourth semiconductor laser device according to the present invention includes: a substrate; and a plurality of light-emitting elements emitting light with different wavelengths and integrated on the substrate. Each of the light-emitting elements includes, on the substrate, an active layer and cladding layers respectively provided on top and bottom of the active layer, one of the cladding layers provided on top of the active layer is an upper cladding layer having a mesa ridge portion, and the width of the ridge portion varies among the light-emitting elements.

In the fourth semiconductor laser device of the present invention, the width of the ridge portion varies among the light-emitting elements, so that an appropriate width of the ridge portion is set depending on the wavelength of each of the light-emitting elements emitting light with different wavelengths. Accordingly, the volume of a saturable absorber formed in the active layer is appropriately set with increase of the operation current value due to increase in vertical divergence angle of light distribution and heat saturation of light power during high-temperature operation prevented. As a result, low-noise lasers with a plurality of wavelengths producing self-oscillation are achieved with high reproducibility.

Preferably, in the fourth semiconductor laser device of the present invention, the light-emitting elements include: a first light-emitting element exhibiting a relatively large threshold-value variation with respect to temperature change; and a second light-emitting element exhibiting a relatively small threshold-value variation with respect to temperature change, and the ridge portion in the first light-emitting element has a width larger than that of the ridge portion in the second light-emitting element. Then, the foregoing advantages are ensured. In this case, the first light-emitting element may include an AlGaInP-based active layer containing InGaP, and the second light-emitting element may include an AlGaAs-based active layer containing GaAs. Then, each of the light-emitting elements emitting light with different wavelengths has an appropriate layer structure depending on its wavelength, so that low-noise self-oscillating lasers with a plurality of wavelengths (specifically, two wavelengths in infrared and red regions) are allowed to be obtained with high reproducibility.

In the first through fourth semiconductor laser devices of the present invention, a semiconductor layer is preferably formed on a side of the ridge portion.

Then, in a case where the same semiconductor layer is formed on the ridge portions of the light-emitting elements, a light confinement layer (i.e., a current blocking layer) is allowed to be formed by the same crystal growth process. Accordingly, the number of crystal growths is reduced, thus simplifying element fabrication processes. In this case, the semiconductor layer is preferably a current blocking layer made of one of AlInP and GaAs. If the semiconductor layer is a current blocking layer of AlInP, an effective refractive index waveguide mechanism is allowed to be achieved in an infrared laser and an red semiconductor laser whose cladding layers are made of AlGaInP-based material, so that the operation current values and oscillation threshold current values of the semiconductor lasers are reduced. If the semiconductor layer is a current blocking layer of GaAs, a refractive index waveguide mechanism is achieved in a multiple-wavelength semiconductor laser device, thus obtaining stable fundamental transverse mode oscillation.

In the first through fourth semiconductor laser devices of the present invention, a dielectric layer is preferably formed on a side of the ridge portion.

Then, a refractive index waveguide mechanism is allowed to be achieved in a multiple-wavelength semiconductor laser device, so that the operation current values and oscillation threshold current values of the semiconductor lasers are reduced. In this case, the dielectric layer is preferably one of, or a stack of two or more of, a SiN layer, a $SiO_2$ layer, a $TiO_2$ layer and an $Al_2O_3$ layer.

In the first through fourth semiconductor laser devices of the present invention, one of a polycrystalline layer and an amorphous layer is preferably formed on a side of the ridge portion.

Then, a light confinement layer (i.e., a current blocking layer) is allowed to be formed on the ridge side by depositing a polycrystalline layer or an amorphous layer without using a method in which a current blocking layer is deposited on the ridge side with crystal growth apparatus. Accordingly, element fabrication processes are simplified. In this case, the polycrystalline layer is preferably a poly-Si layer. The amorphous layer is preferably one of, or a stack of two or more of, an amorphous Si layer, an amorphous Ge layer and an amorphous SiGe layer. Then, a refractive index waveguide mechanism is achieved in a multiple-wavelength semiconductor laser device, thus obtaining stable fundamental transverse mode oscillation.

In the first through fourth semiconductor laser devices of the present invention, the cladding layer is preferably an AlGaInP-based cladding layer. Then, a two-wavelength semiconductor laser device in infrared and red regions is allowed to be obtained.

A method for fabricating a semiconductor laser device according to the present invention is a method for fabricating a semiconductor laser device including a substrate and a plurality of light-emitting elements emitting light with different wavelengths and integrated on the substrate. The method includes the steps of: forming a lower cladding layer, an active layer, a first upper cladding layer, an etching stopper layer and a second upper cladding layer in this order on the substrate in a region of each of the light-emitting elements; and patterning the second upper cladding layer into a mesa shape, thereby forming a ridge portion, wherein the thickness of the etching stopper layer varies among the light-emitting elements.

That is, the method for fabricating a semiconductor laser device according to the present invention is a method for fabricating the first semiconductor laser device of the present invention described above, and the foregoing advantages are obtained.

As described above, according to the present invention, in a semiconductor laser device in which a plurality of light-emitting elements emitting light with different wavelengths are integrated on the same substrate, e.g., in a two-wavelength semiconductor laser device in red and infrared regions, $\Delta N$ (the effective refractive-index difference between the inside and outside a current injection stripe) i.e., the shape of light distribution, is allowed to be precisely controlled without decrease of a COD (melt fracture) level and degradation of efficiency in utilizing light in an optical system. Accordingly, a multiple-wavelength semiconductor laser device which has a low-noise characteristic with self-oscillation and in which no heat saturation occurs even under a high temperature of, for example, about 85° C. is achieved.

That is, the present invention is very useful in application to semiconductor laser devices for use as light sources for pickups in optical disk apparatus or light sources necessary for, for example, other electronic devices and information processors.

DETAILED DESCRIPTION OF THE INVENTION

Hereinafter, a semiconductor laser device and a method for fabricating the device according an embodiment of the present invention will be described with reference to the drawings.

Figure 1:
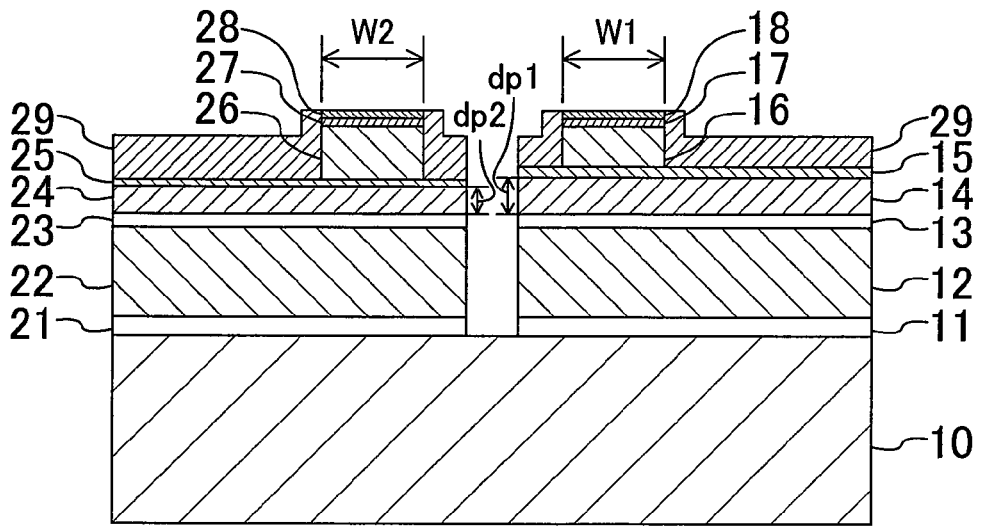
FIG. 1 is a view schematically illustrating a cross-sectional structure of a semiconductor laser device according to an embodiment of the present invention.

FIG. 1 is a cross-sectional view schematically illustrating a structure of a semiconductor laser device according to an embodiment of the present invention. In the structure illustrated in FIG. 1, a red laser and an infrared laser are integrated on an n-type GaAs substrate 10 whose principal plane is inclined with respect to the (100) plane toward the [011] direction at 10°, for example.

First, a structure of the infrared laser will be described. In the infrared laser, an n-type GaAs buffer layer 11 (with a thickness of 0.5 µm), an n-type $(Al_{0.7}Ga_{0.3})_{0.51}In_{0.49}P$ lower cladding layer 12 (with a thickness of 2.0 µm), an AlGaAs-based active layer 13 (with a thickness of 200 Å) having a quantum well structure and containing GaAs, a p-type $(Al_{0.7}Ga_{0.3})_{0.51}In_{0.49}P$ first upper cladding layer 14 (with a thickness dp1), a p-type GaInP etching stopper layer 15 (with a thickness ES1), a p-type $(Al_{0.7}Ga_{0.3})_{0.51}In_{0.49}P$ second upper cladding layer 16 (with a thickness dp2), a p-type $Ga_{0.51}In_{0.49}P$ protective layer 17 (with a thickness of 500 Å) and a p-type GaAs contact layer 18 (with a thickness of 0.4 µm) are stacked on the n-type GaAs substrate 10. The second upper cladding layer 16 is formed as a mesa ridge. This ridge, the protective layer 17 and the contact layer 18 form a stripe extending in one direction. An n-type GaAs current blocking layer 29 (with a thickness of 0.7 µm) is formed on the side of the ridge. The thickness ES1 of the etching stopper layer 15 is small, i.e., about several to 10% of the thicknesses dp1 and dp2 of the upper cladding layers 14 and 16.

With the structure of the infrared laser, current injected from the p-type GaAs contact layer 18 is confined only in the ridge (i.e., the second upper cladding layer 16) by the current blocking layer 29 and, thereby, is concentrated and injected into a portion of the active layer 13 located under the ridge. As a result, carrier population inversion necessary for laser oscillation is achieved with a small amount of injected current of about several tens of mA. At this time, light generated by recombination of carriers injected in the active layer 13 is confined in the direction vertical to the active layer 13 by the cladding layers 12, 14 and 16 (vertical light confinement), whereas the laser light is absorbed in the current blocking layer 29 and thus is guided only in the ridge to be confined in the direction parallel to the active layer 13 (horizontal light confinement). Since the current blocking layer 29 absorbs laser oscillation light, a large waveguide loss of several tens of $cm^{-1}$ or more occurs with respect to light distribution of oscillation in a higher-level transverse mode, and the higher-level transverse mode oscillation is suppressed. As a result, the higher-level transverse mode oscillation is also suppressed in a structure having a very small refractive index step, i.e., where ΔN (i.e., an effective refractive index difference between the inside and outside of the current injection stripe) is $1\times10^{-3}$ or less, so that stable fundamental transverse mode oscillation is obtained. This allows a highly-symmetric far field pattern (FFP) to be obtained.

In the infrared laser, the etching stopper layer 15 allows the thickness dp1 (i.e., the distance between the current blocking layer 29 and the active layer 13) of the first upper cladding layer 14 to be controlled with high precision, so that ΔN is controlled on an order lower than $1\times10^{-3}$. Accordingly, the shape of light distribution is precisely controlled, so that a saturable absorber necessary for self-oscillation is precisely formed in the active layer 13 even at a high temperature of 85° C. or more, for example. As a result, a low-power-consumption low-noise infrared laser in which heat saturation of light power does not occur even in high-temperature operation is obtained.

To suppress power consumption by reducing the operation carrier density in the active layer 13, reducing leakage current during high-temperature operation and reducing differential resistance (Rs) in current-voltage characteristics, the width (W1) of the bottom of the ridge (i.e., the second upper cladding layer 16) in the infrared laser needs to be as large as possible. However, if the width W1 is too large, the proportion of light distribution in the portion of the active layer 13 under the current blocking layer 29 is small, so that the volume of the saturable absorber is small. As a result, no self-oscillation is obtained. Therefore, to obtain a self-oscillating laser capable of operating at high temperature, dp1 and W1 need to be precisely set as described later.

Next, a structure of the red laser will be described. In the red laser, an n-type GaAs buffer layer 21 (with a thickness of 0.5 μm), an n-type $(Al_{0.7}Ga_{0.3})_{0.51}In_{0.49}P$ lower cladding layer 22 (with a thickness of 2.0 μm), an AlGaInP-based active layer 23 (with a thickness of 500 Å) having a strained quantum well structure and containing InGaP, a p-type $(Al_{0.7}Ga_{0.3})_{0.51}In_{0.49}P$ first upper cladding layer 24 (with a thickness dp2), a p-type GaInP etching stopper layer 25 (with a thickness ES2), a p-type $(Al_{0.7}Ga_{0.3})_{0.51}In_{0.49}P$ second upper cladding layer 26 (with a thickness dp1), a p-type $Ga_{0.51}In_{0.49}P$ protective layer 27 (with a thickness of 500 Å) and a p-type GaAs contact layer 28 (with a thickness of 0.4 μm) are stacked on the n-type GaAs substrate 10. The second upper cladding layer 26 is formed as a mesa ridge. This ridge, the protective layer 27 and the contact layer 28 form a stripe extending in one direction. An n-type GaAs current blocking layer 29 (with a thickness of 0.7 μm) is formed on the side of the ridge. The thickness ES2 of the etching stopper layer 25 is small, i.e., about several to 10% of the thicknesses dp2 and dp1 of the upper cladding layers 24 and 26.

In the structure of the red laser, current injected from the p-type GaAs contact layer 28 is confined only in the ridge (i.e., the second upper cladding layer 26) by the current blocking layer 29 and, thereby, is concentrated and injected into a portion of the active layer 23 located under the ridge. As a result, carrier population inversion necessary for laser oscillation is achieved by a small amount of injected current of about several tens of mA. At this time, light generated by recombination of carriers injected in the active layer 23 is confined in the direction vertical to the active layer 23 by the cladding layers 22, 24 and 26 (vertical light confinement), whereas the laser light is absorbed in the current blocking layer 29 and thus is guided only in the ridge to be confined in the direction parallel to the active layer 23 (horizontal light confinement). Since the current blocking layer 29 absorbs laser oscillation light, a large waveguide loss of several tens of $cm^{-1}$ or more occurs with respect to light distribution of oscillation in a higher-level transverse mode, and the higher-level transverse mode oscillation is suppressed. As a result, the higher-level transverse mode oscillation is also suppressed in a structure having a very small refractive index step, i.e., where ΔN (i.e., the effective refractive index difference between the inside and outside of the current injection stripe) is $1\times10^{-3}$ or less, so that stable fundamental transverse mode oscillation is obtained. This allows a highly-symmetric far field pattern (FFP) to be obtained.

In the red laser, as in the infrared laser, the etching stopper layer 25 allows the thickness dp2 (i.e., the distance between the current blocking layer 29 and the active layer 23) of the first upper cladding layer 24 to be controlled with high precision, so that ΔN is controlled on an order lower than $1\times10^{-3}$. Accordingly, the shape of light distribution is precisely controlled, so that a saturable absorber necessary for self-oscillation is precisely formed in the active layer 23 even at a temperature of 85° C. or more, for example. As a result, a low-noise red laser in which heat saturation of light power does not occur even in high-temperature operation is obtained.

To suppress power consumption by reducing the operation carrier density in the active layer 23, reducing leakage current during high-temperature operation and reducing differential resistance (Rs) in current-voltage characteristics, the width (W2) of the bottom of the ridge (i.e., the second upper cladding layer 26) of the red laser needs to be as large as possible. However, if the width W2 is too large, the proportion of light distribution in the portion of the active layer 23 under the current blocking layer 29 is small, so that the volume of the saturable absorber is small. As a result, no self-oscillation is obtained. Therefore, to obtain a self-oscillating laser capable of operating at high temperature, dp2 and W2 need to be precisely set as described later.

In the two-wavelength laser device of this embodiment, it is assumed that the resonator length of each laser is set at 350 μm, for example.

Now, preferred ranges of dp1, dp2, W1 and W2 in the laser structure of this embodiment will be described.

First, the thickness (dp1) of the first upper cladding layer 14 of the infrared laser and the thickness (dp2) of the first upper cladding layer 24 of the red laser enough to obtain desired ΔN in the laser structure of this embodiment illustrated in FIG. 1 will be described.

Figure 2A:
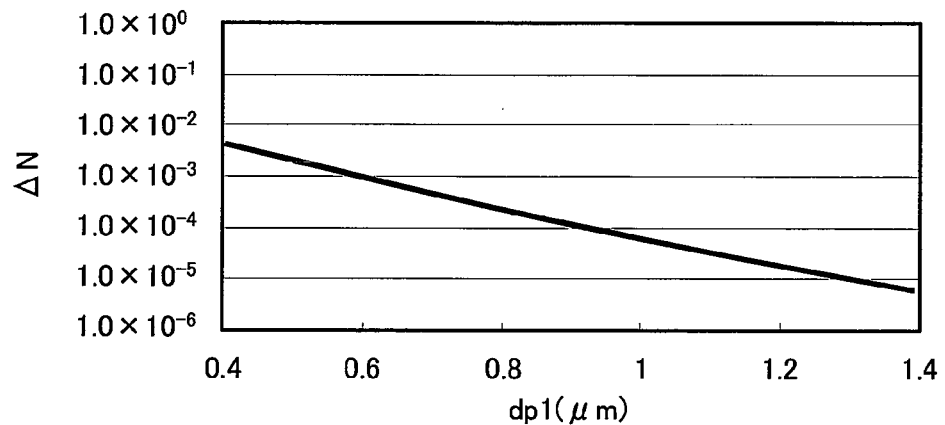
FIGS. 2A and 2B are graphs showing calculation results on $\Delta N$ when the thickness dp1 of a first upper cladding layer in an infrared laser and the thickness dp2 of a first upper cladding layer in a red laser in the semiconductor laser device of the embodiment vary.
Figure 2B:
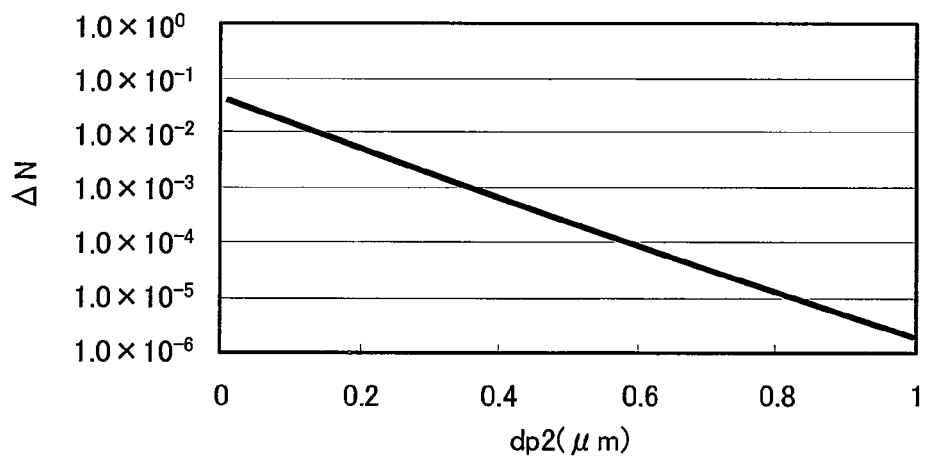

FIGS. 2A and 2B show calculation results of ΔN when dp1 and dp2 vary. As shown in FIGS. 2A and 2B, as dp1 and dp2 increase, the values of ΔN decrease. It should be noted in these graphs that the thickness of the first upper cladding layer in the infrared laser is larger than that in the red laser to obtain the same ΔN. This is because of the following reason. Since the wavelength of the infrared laser in the waveguide is longer than that of the red laser, light distribution propagating in the waveguide of the infrared laser is also larger than that of the red laser. Accordingly, suppose the thicknesses of the first upper cladding layers are the same in these lasers, light distribution in the infrared laser more easily expands in the vertical direction, i.e., the direction in which the layers are deposited, so that the light distribution is more easily affected by the current blocking layer. As shown in FIGS. 2A and 2B, to obtain the value of $1\times10^{-4}$ as ΔN, dp2 needs to be about 0.58 μm in the red laser, whereas dp1 needs to be about 0.93 μm in the infrared laser. Accordingly, the thickness of the first upper cladding layer of the infrared laser needs to be about 1.6 times as large as that of the red laser.

A semiconductor laser is generally junction-down mounted to achieve excellent heat dissipation such that the pn junction side (i.e., the side opposite to the substrate) is located near a heatsink. In a two-wavelength semiconductor laser device, the heights of light emission points of the respective lasers are preferably the same, in consideration of coupling to an optical pickup system. In view of this, the distance from the upper surface of the active layer to the upper end of the ridge is preferably the same between the red laser and the infrared laser. Accordingly, to obtain desired high output and low-noise characteristics in a case where dp1 and dp2 are different, the thicknesses (i.e., the heights of the ridges) of the second upper cladding layers in the respective red and infrared lasers need to differ from each other. Specifically, as described above, if the thickness of the first upper cladding layer in the infrared laser is set larger than that in the red laser, the thickness (i.e., the height of the ridge) of the second upper cladding layer in the red laser is preferably set larger than that in the infrared laser.

If no etching stopper layer is interposed between the first upper cladding layer and the second upper cladding layer, the thickness of the second upper cladding layer, i.e., the height of the ridge, is disadvantageously determined by the etching time in ridge formation. Accordingly, if no etching stopper layer is used, especially if the ridges of the respective red and infrared lasers are formed at a time so as to simplify formation of the lasers, it is extremely difficult to make the distance from the upper surface of the active layer to the upper end of the ridge the same between the red laser and the infrared laser. On the other hand, as in this embodiment, if the etching stopper layers are used in the red laser and the infrared laser, etching selectivity between the etching stopper layer and the second upper cladding layer is obtained so that the distance from the upper surface of the active layer to the upper end of the ridge is set at a desired value in each of the lasers. In this embodiment, to maintain etching selectivity with the second upper cladding layer, InGaP is used as a material for the etching stopper layer in each of the red laser and the infrared laser.

Now, a laser structure for obtaining a desired low-noise laser capable of operating at high temperature will be described. The stripe widths (W1 and W2 in FIG. 1) and $\Delta N$ are parameters affecting the volume of a saturable absorber necessary for self-oscillation. This is because the width of light distribution in the horizontal direction and the density of current injected in the active layer greatly change depending on the stripe width, and the degree of leakage of light distribution into a portion of the active layer under the current blocking layer greatly changes depending on $\Delta N$.

Figure 3A:
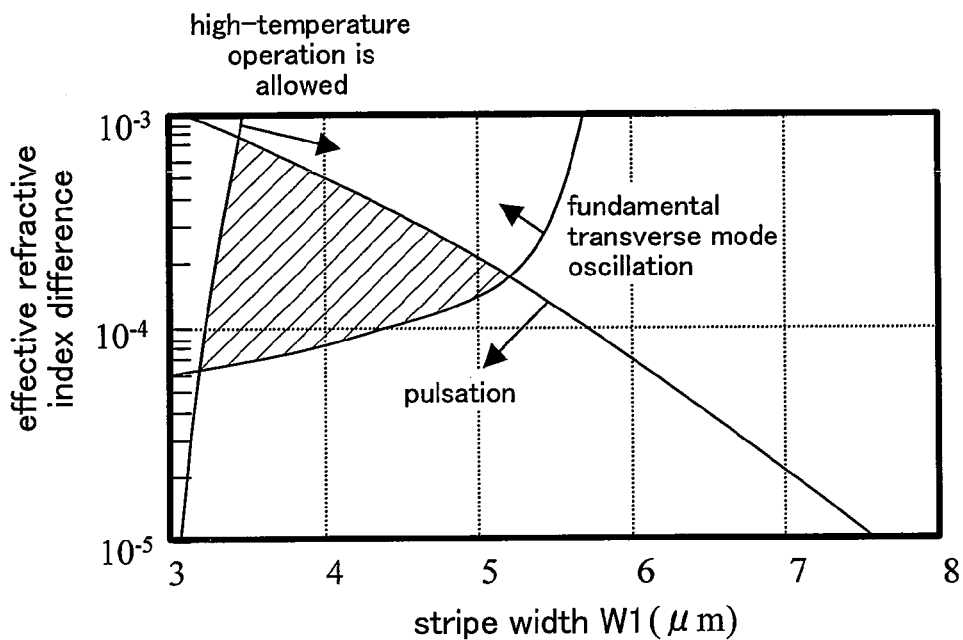
FIGS. 3A and 3B are graphs showing evaluation results on characteristics of the infrared laser and the red laser when $\Delta N$ and the stripe widths in the semiconductor laser device of the embodiment vary.
Figure 3B:
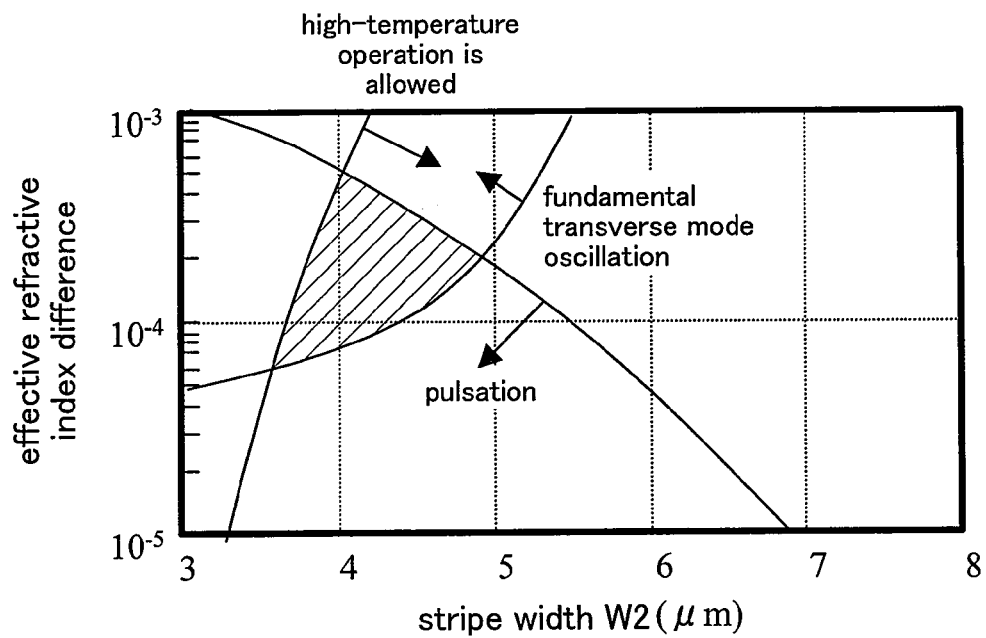

FIGS. 3A and 3B show evaluation results on characteristics of the infrared laser and the red laser, respectively, when $\Delta N$ and the stripe widths vary. FIG. 3A shows evaluation results on characteristics of the infrared laser and FIG. 3B shows evaluation results on characteristic of the red laser.

As shown in FIGS. 3A and 3B, to obtain a light power of 5 mW or more which is necessary for reproducing an optical disk at a high temperature of, for example, 85° C., the stripe width is preferably as large as possible. This is because of the following reason. If the stripe width is large, the density of carriers injected into the active layer decreases so that leakage current decreases and Rs (differential resistance) decreases. Accordingly, heat dissipation of the laser decreases. To obtain self-oscillation (pulsation), the stripe width is preferably as small as possible and $\Delta N$ is preferably as small as possible. This is because of the following reason. If the stripe width is small, the proportion of light distribution leaking outside the stripe is large, so that a large saturable absorber is allowed to be formed in a portion of active layer under the current blocking layer. If $\Delta N$ is small, the proportion of light distribution leaking outside the stripe is also large so that a large saturable absorber is allowed to be formed in the active layer under the current blocking layer. However, if $\Delta N$ is too small, the stability of light distribution is impaired, resulting in that nonlinearity (kink) in higher-level transverse mode oscillation and current-light power characteristics is likely to occur. Accordingly, to achieve all of the high-temperature operation, a low-noise characteristic and a stable fundamental transverse mode oscillation even at a high temperature of 85° C., the laser structures in which $\Delta N$ and the stripe widths fall within the diagonally-shaded areas in FIGS. 3A and 3B should be adopted.

In this embodiment, a structure in which the stripe width (W2 in FIG. 1) is 4 µm and $\Delta N$ is $2 \times 10^{-4}$ (i.e., dp2 is 0.55 µm) in the red laser and the stripe width (W1 in FIG. 1) is 4.2 µm and $\Delta N$ is $1.08 \times 10^{-4}$ (i.e., dp1 is 0.85 µm) in the infrared laser is adopted.

To achieve the structure having $\Delta N$ as described above with high reproducibility, the etching stopper layer of InGaP is used between the first upper cladding layer and the second upper cladding layer (i.e., the ridge) in each of the infrared laser and the red laser in this embodiment. The InGaP etching stopper layer has a refractive index higher than that of the AlGaInP-based cladding layer. Accordingly, if the thickness of the etching stopper layer is too large, light distribution in the vertical direction is likely to be concentrated in the active layer, leading to an increase in vertical divergence angle of light distribution in an FFP and decrease of a COD level. When the vertical divergence angle increases, the amount of light taken in a lens of an optical pickup decreases, so that the efficiency in using light decreases. Accordingly, the thickness of the etching stopper layer is preferably as small as possible.

As described above, to obtain the same $\Delta N$, the thickness (dp1) of the first upper cladding layer 14 in the infrared laser needs to be larger than the thickness (dp2) of the first upper cladding layer 24 in the red laser, so that the distance from the ridge upper end to the etching stopper layer (i.e., the thickness of the second upper cladding layer serving as the ridge) in the infrared laser is smaller than that in the red laser. Accordingly, if the ridges of the respective red and infrared lasers are formed in the same etching process, etching reaches the etching stopper layer in the infrared laser faster than the etching stopper layer in the red laser. In this etching process, the etching stopper layer of the infrared laser should not be completely removed by etching until formation of the ridge in the red laser is completed. However, in this embodiment, even if an etchant having etching selectivity between InGaP forming the etching stopper layer and the ridge, i.e., AlGaInP forming the second upper cladding layer, is used, it is extremely difficult to completely prevent etching of the etching stopper layer, and approximately several tens of Å is inevitably removed.

Especially in the red laser, the energy difference between the conduction band of the active layer and the conduction band of the cladding layer is small so that electrons are likely to overflow from the active layer to the p-type cladding layer (i.e., the upper cladding layer). Accordingly, to enhance temperature characteristics, operation current value needs to be as small as possible. Therefore, to prevent decrease of the COD level or increase of the operation current value due to increase of the vertical divergence angle, i.e., due to decrease in light utilization efficiency, the etching stopper layer of the red laser needs to be as thin as possible.

In addition, as described above, the thickness of the etching stopper layer in the infrared laser needs to be larger than that of the etching stopper layer in the red laser, in consideration of the difference in time during which the etching stopper layer is subjected to etching.

In view of this, in this embodiment, the thickness ES2 of the etching stopper layer 25 in the red laser is 90 Å and the thickness ES1 of the etching stopper layer 15 in the red laser is 110 Å. However, the thicknesses ES1 and ES2 are not limited to these values, and may be set such that the ES1 is larger than ES2 by 20 Å or more as long as ES1 and ES2 are within the range from 50 Å to 200 Å.

To prevent decrease in fabrication yield by increasing a design margin of an optical system in the laser structure of this embodiment, the difference in astigmatic difference between the infrared laser and the red laser is preferably small.

Figure 10A:
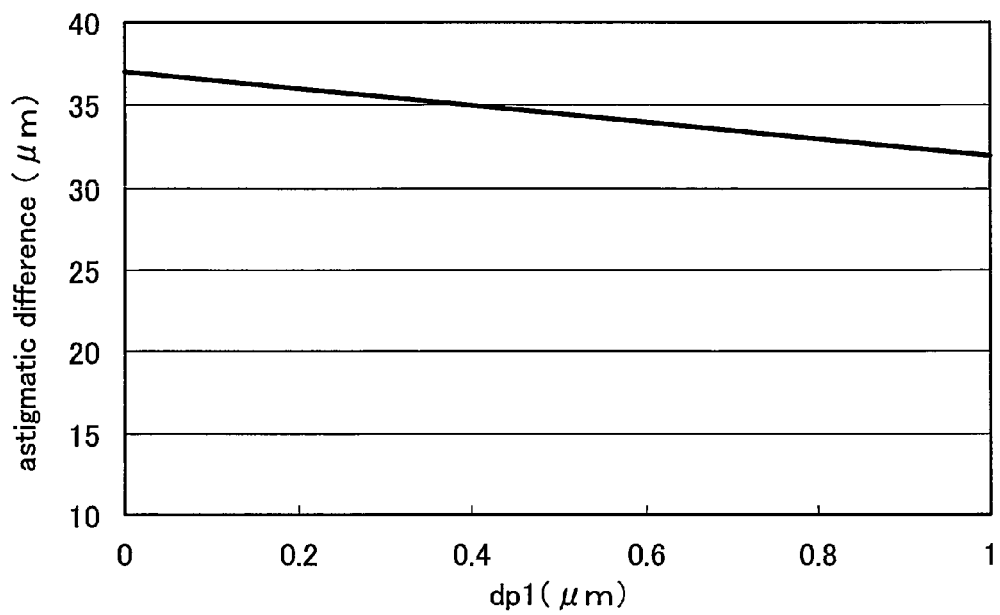
FIGS. 10A and 10B are graphs showing calculation results on astigmatic difference when the thickness dp1 of the first upper cladding layer in the infrared laser and the thickness dp2 of the first upper cladding layer in the red laser vary in the semiconductor laser device of the embodiment.
Figure 10B:
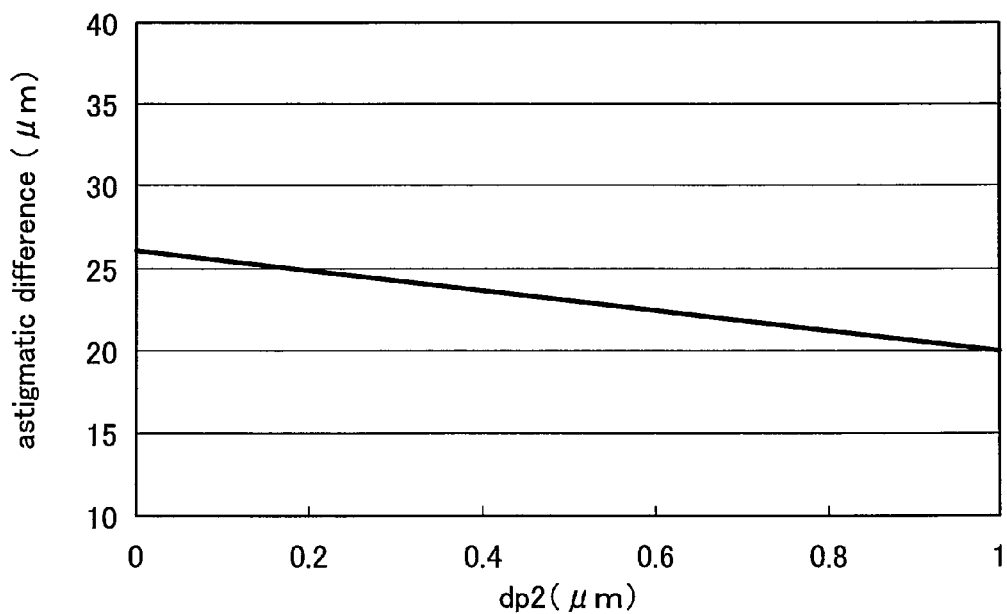

FIGS. 10A and 10B show calculation results on astigmatic difference when dp1 (i.e., the thickness of the first upper cladding layer 14 in the infrared laser) and dp2 (i.e., the thickness of the first upper cladding layer 24 in the red laser) vary. As shown in FIGS. 10A and 10B, as dp1 and dp2 increase, the astigmatic differences decrease. Suppose that dp1 and dp2 are the same, the astigmatic difference in the infrared laser is larger than that in the red laser. In consideration of coupling to an optical pickup, the astigmatic differences of the lasers in the two-wavelength laser device are preferably the same or close to each other. According to the results shown in FIGS. 10A and 10B, the difference in astigmatic difference between the lasers is reduced by setting the thickness dp2 of the first upper cladding layer 24 in the red laser smaller than the thickness dp1 of the first upper cladding layer 14 in the infrared laser. As a result, the efficiency in coupling to a lens is enhanced, thus enabling reduction of operation current.

Figure 11A:
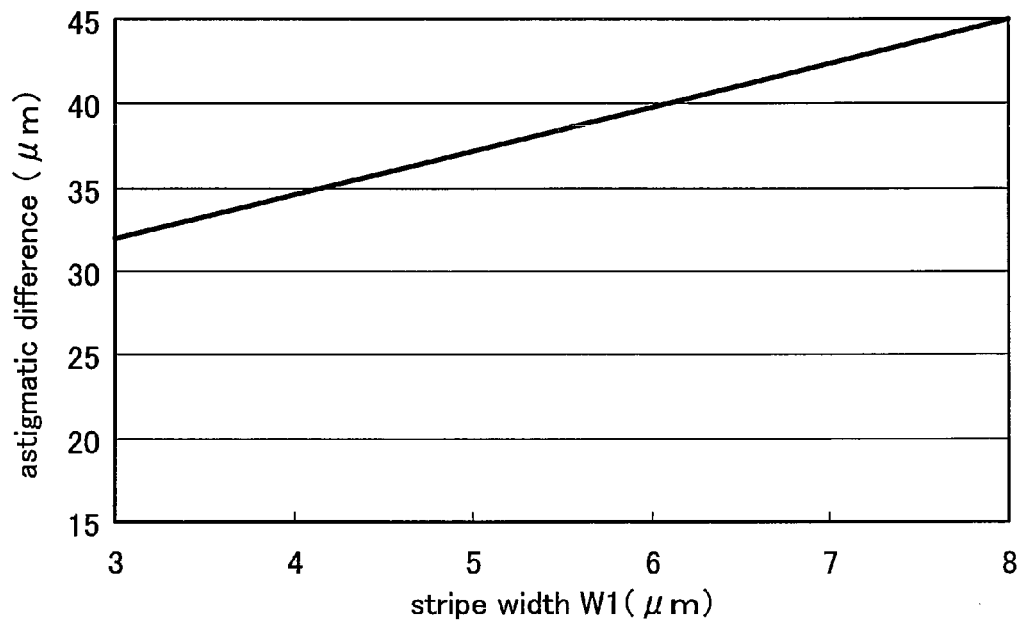
FIGS. 11A and 11B are graphs showing calculation results on astigmatic difference when the stripe width W1 of the infrared laser and the width W2 of the red laser vary in the semiconductor laser device of the embodiment.
Figure 11B:
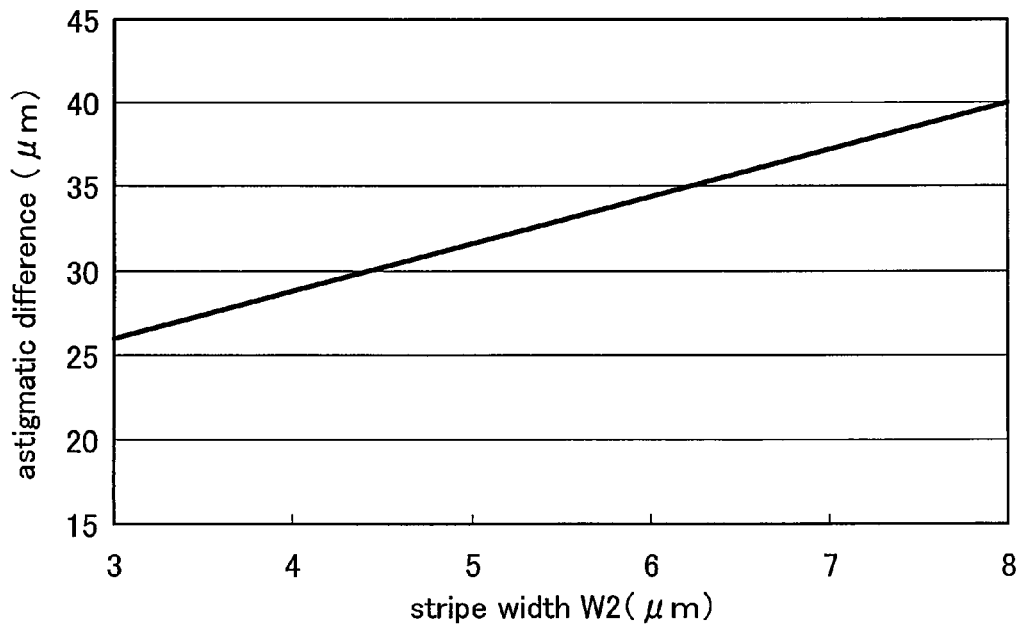

FIGS. 11A and 11B show calculation results on astigmatic difference when the ridge width (i.e., the stripe width W1 in FIG. 1) of the infrared laser and the ridge width (i.e., the width W2 in FIG. 1) of the red laser vary. As shown in FIGS. 11A and 11B, as the stripe widths W1 and W2 increase, the astigmatic differences increase. If the stripe widths W1 and W2 are the same, the astigmatic difference in the infrared laser is larger than that in the red laser. As described above, in consideration of coupling to an optical pickup, the astigmatic differences of the lasers in the two-wavelength laser device is preferably the same or close to each other. According to the results shown in FIGS. 11A and 11B, if the ridge width (i.e., the stripe width W2) of the red laser is set larger than the ridge width (i.e., the stripe width W1) of the infrared laser, the difference in astigmatic difference between the lasers is reduced. As a result, the efficiency in coupling to a lens is enhanced, thus enabling reduction of operation current.

Figure 4A:
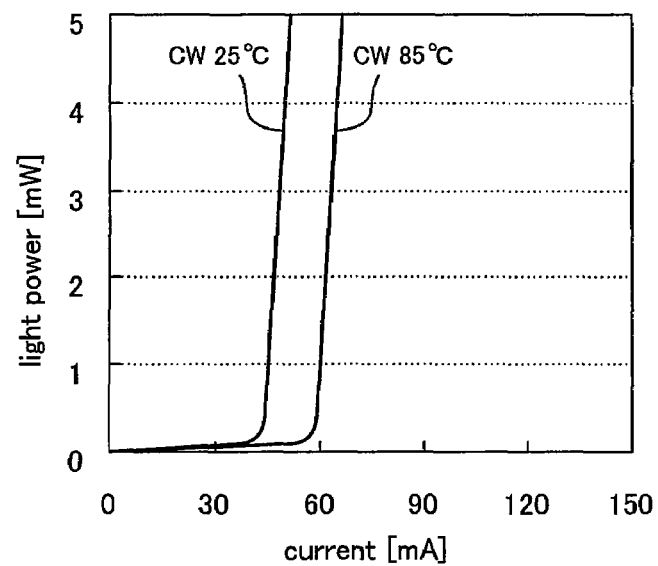
FIGS. 4A and 4B are graphs showing evaluation results on current-light power characteristics of the infrared laser and the red laser in the semiconductor laser device of the embodiment.
Figure 4B:
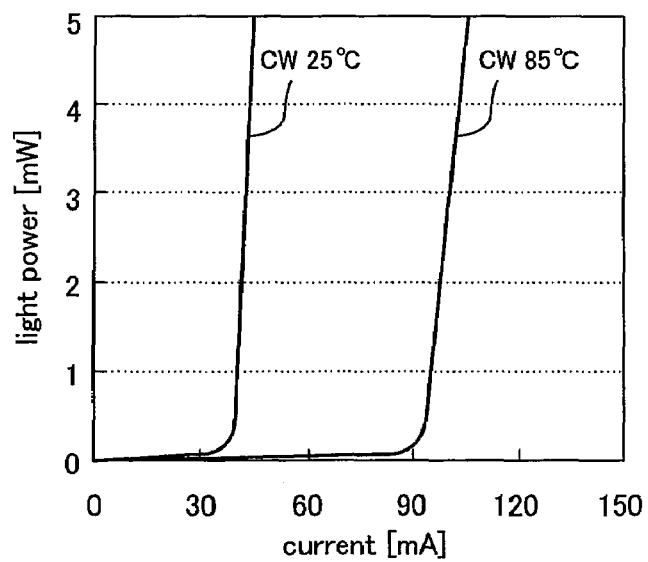

The threshold value variation (i.e., temperature dependence of current-light power characteristics shown in FIGS. 4A and 4B described later) of the red laser is larger than that of the infrared laser. That is, the stripe width W2 of the red laser is preferably larger than the stripe width W1 of the infrared laser. In other words, the stripe width W2 of the red laser whose threshold value variation with respect to temperature variation is relatively large is preferably set at a relatively large value. Then, the volume of the saturable absorber is reduced and, thus, the light absorption loss is reduced, so that the slope efficiency is made higher than the laser with a small stripe width. As a result, the threshold value and the operation current value decrease. As described above, to reduce operation current in the red laser exhibiting a large threshold value variation with respect to the temperature variation (i.e., allowance for temperature variation is smaller than that in the infrared laser), the stripe width W2 of the red laser is set at a large value.

Figure 12:
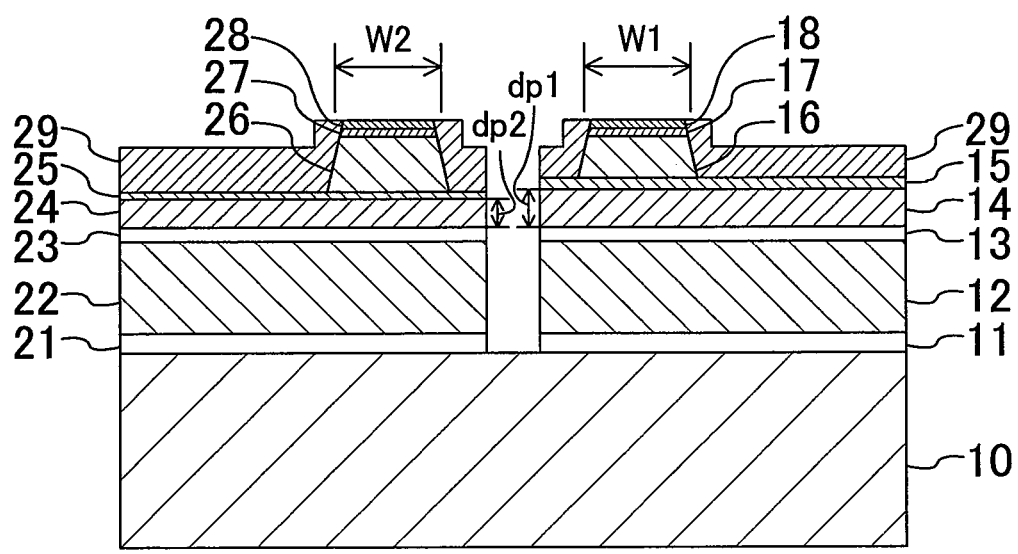
FIG. 12 is a view illustrating a variation of a cross-sectional structure of the semiconductor laser device of the embodiment.

In this embodiment, a case where the ridge widths in the resonator direction (i.e., the direction in which the ridge extends) and in the direction along the ridge height are uniform is described as an example. Alternatively, as shown in FIG. 12, for example, the ridge width may decrease toward the upper end of the ridge. In other words, the cross-sectional shape of each ridge may be tapered. Alternatively, the ridge width may vary in the resonator direction. In a case where the ridge width varies in the resonator direction or in the ridge height direction in this manner, it is sufficient to use the average values of the ridge width in the resonator direction or the ridge height direction as the stripe widths W1 and W2.

Now, current-light power characteristics of the infrared laser and the red laser with continuous wave (CW), i.e., a current waveform, under 85° C. in the two-wavelength semiconductor laser device with the laser structure of this embodiment described above are shown in FIGS. 4A and 4B. FIG. 4A shows current-light power characteristics of the infrared laser. FIG. 4B shows current-light power characteristics of the red laser. FIGS. 4A and 4B also show current-light power characteristics of the infrared laser and the red laser with CW under 25° C., for comparison. As shown in FIGS. 4A and 4B, in the two-wavelength semiconductor laser device of this embodiment, excellent current-light power characteristics having excellent linearity without occurrence of kink, are exhibited even under a high temperature of 85° C. in both of the red laser and the infrared laser.

Figure 5A:
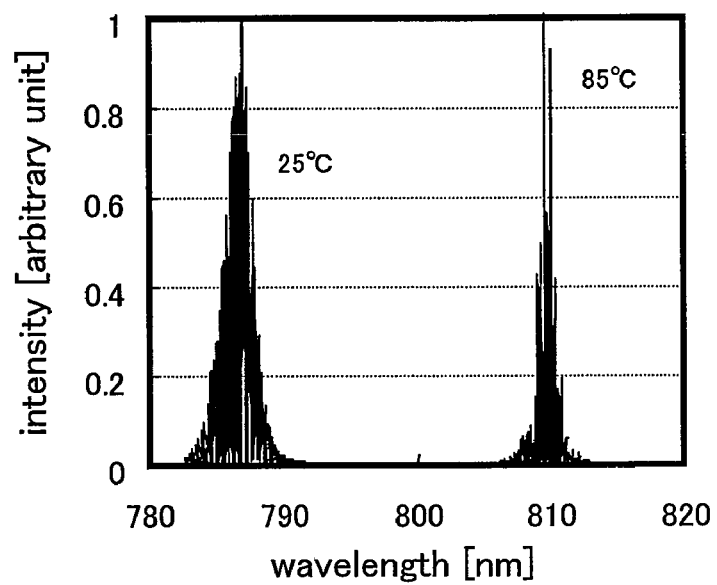
FIGS. 5A and 5B are graphs showing temperature dependence evaluation results on oscillation spectrum characteristics of the infrared laser and the red laser in the semiconductor laser device of the embodiment.
Figure 5B:
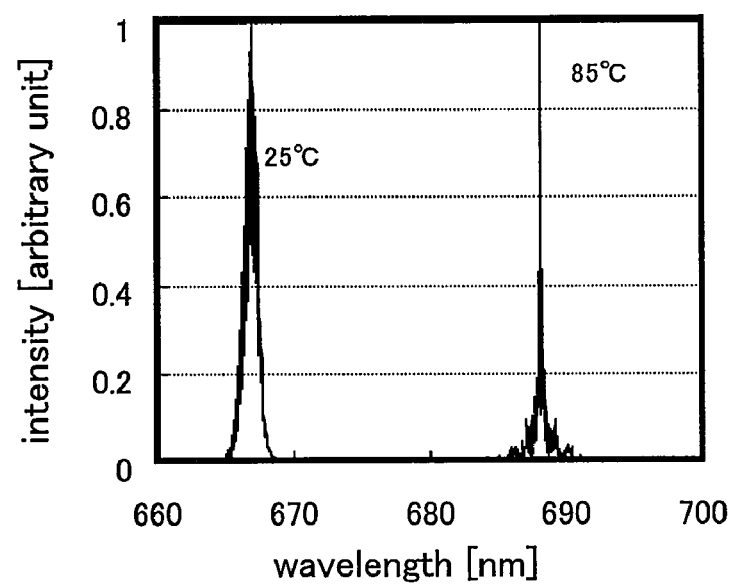

Then, oscillation spectrum characteristics of the infrared laser and the red laser with CW under 85° C. in the two-wavelength semiconductor laser device with the laser structure of this embodiment are shown in FIGS. 5A and 5B. FIG. 5A shows oscillation spectrum characteristics of the infrared laser. FIG. 5B shows oscillation spectrum characteristics of the red laser. In FIGS. 5A and 5B, for comparison with oscillation spectrum characteristics under a high temperature of 85° C., oscillation spectrum characteristics under 25° C. are also shown. As shown in FIGS. 5A and 5B, in the two-wavelength semiconductor laser device of this embodiment, low-noise lasers capable of sufficiently operating even under a high temperature of 85° C. are obtained for both of the red laser and the infrared laser.

FIGS. 6A through 6C, FIGS. 7A through 7C and FIG. 8 are cross-sectional views showing respective process steps of a method for fabricating a semiconductor laser device according to an embodiment of the present invention.

Figure 6A:
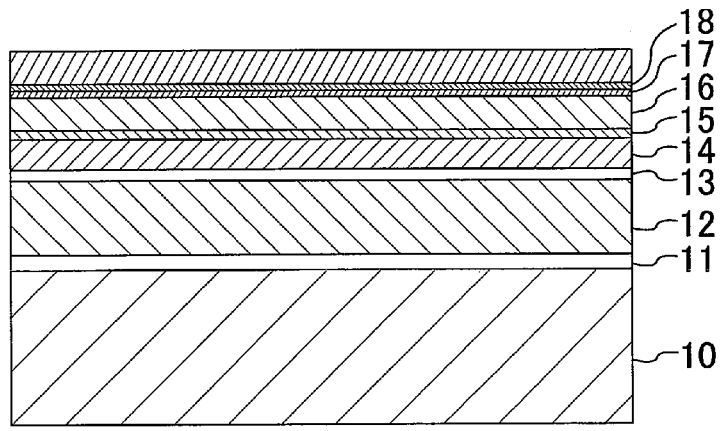
FIGS. 6A through 6C are cross-sectional views showing respective process steps of a method for fabricating a semiconductor laser device according to the embodiment.

First, as shown in FIG. 6A, in a first crystal growth process using, for example, a metal organic chemical vapor deposition (MOCVD) or molecular beam epitaxy (MBE), an n-type GaAs buffer layer 11 (with a thickness of 0.5 μm), an n-type $(Al_{0.7}Ga_{0.3})_{0.51}In_{0.49}P$ lower cladding layer 12 (with a thickness of 2.0 μm), an AlGaAs-based active layer 13 (with a thickness of 200 Å) having a quantum well structure and containing GaAs, a p-type $(Al_{0.7}Ga_{0.3})_{0.51}In_{0.49}P$ first upper cladding layer 14 (with a thickness dp1), a p-type GaInP etching stopper layer 15 (with a thickness ES1), a p-type $(Al_{0.7}Ga_{0.3})_{0.51}In_{0.49}P$ second upper cladding layer 16 (with a thickness dp2), a p-type $Ga_{0.51}In_{0.49}P$ protective layer 17 (with a thickness of 500 Å) and a p-type GaAs contact layer 18 (with a thickness of 0.4 μm) are stacked by MOCVD or MBE on an n-type GaAs substrate 10 whose principal plane is inclined with respect to the (100) plane toward the [011] direction at 10°, for example.

In this embodiment, a multiple quantum well structure is used for the active layer 13. Alternatively, a single quantum well structure or a bulk structure may be used. The conductivity type of the active layer 13 is not limited and may be p-type, n-type or undoped.

Figure 6B:
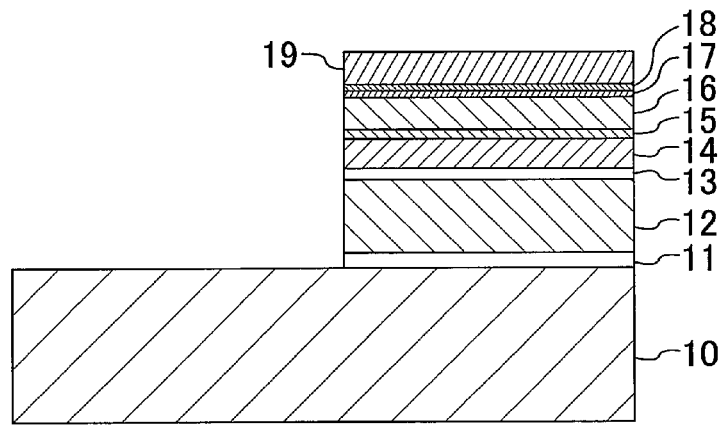

Next, the substrate 10 is taken out of an MOCVD reactor or an MBE reactor. Then, as shown in FIG. 6B, a resist pattern 19 is formed in an infrared laser region by photolithography. Thereafter, using the resist pattern 19 as a mask, portions of the contact layer 18, the protective layer 17, the second upper cladding layer 16, the etching stopper layer 15, the first upper cladding layer 14, the active layer 13, the lower cladding layer 12 and the buffer layer 11 in a region not masked with the resist pattern 19 are removed with a sulfuric acid-based or hydrochloric acid-based etchant.

Figure 6C:
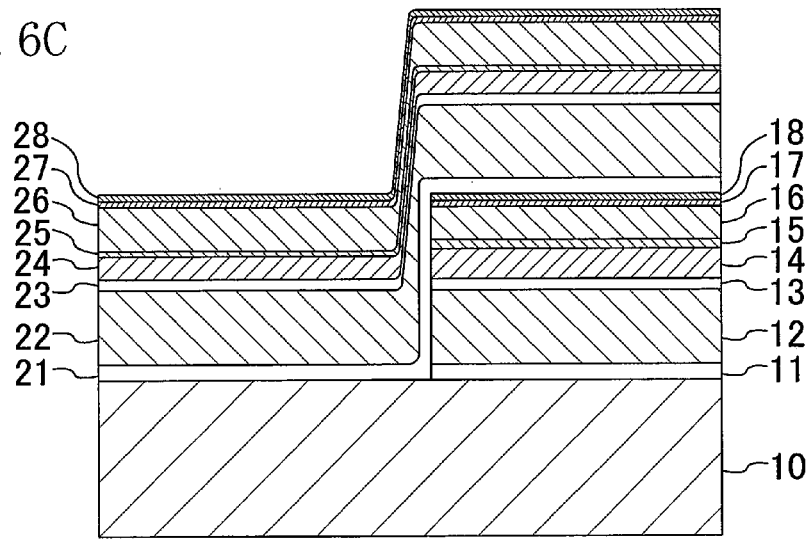

Then, after the resist pattern 19 is removed, as shown in FIG. 6C, an n-type GaAs buffer layer 21 (with a thickness of 0.5 μm), an n-type $(Al_{0.7}Ga_{0.3})_{0.51}In_{0.49}P$ lower cladding layer 22 (with a thickness of 2.0 μm), an AlGaInP-based active layer 23 (with a thickness of 500 Å) having a strained quantum well structure and containing InGaP, a p-type $(Al_{0.7}Ga_{0.3})_{0.51}In_{0.49}P$ first upper cladding layer 24 (with a thickness dp2), a p-type GaInP etching stopper layer 25 (with a thickness ES2), a p-type $(Al_{0.7}Ga_{0.3})_{0.51}In_{0.49}P$ second upper cladding layer 26 (with a thickness dp1), a p-type $Ga_{0.51}In_{0.49}P$ protective layer 27 (with a thickness of 500 Å) and a p-type GaAs contact layer 28 (with a thickness of 0.4 μm) are stacked on the n-type GaAs substrate 10 by MOCVD or MBE.

Figure 7A:
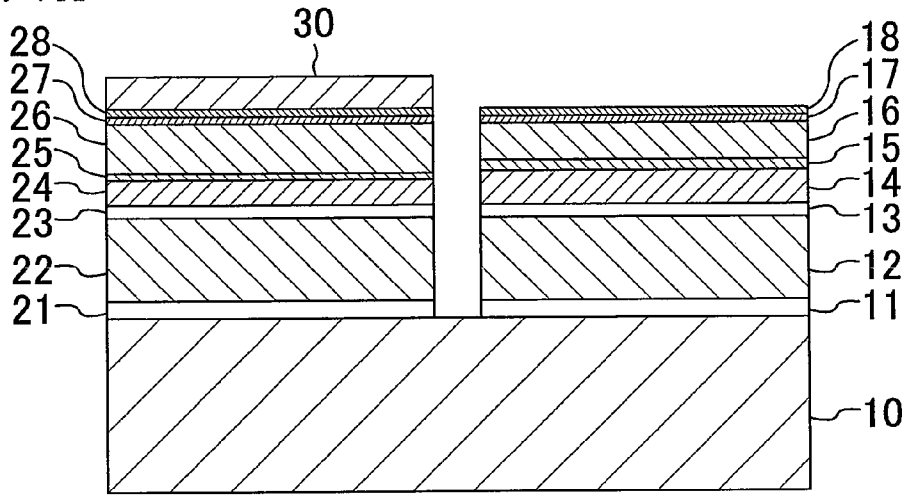
FIGS. 7A through 7C are cross-sectional views showing respective process steps of the method for fabricating a semiconductor laser device according to the embodiment.

Subsequently, the substrate 10 is taken out of the MOCVD reactor or the MBE reactor. Then, as shown in FIG. 7A, a resist pattern 30 is formed in a red laser region by photolithography. Thereafter, using the resist pattern 30 as a mask, portions of the contact layer 28, the protective layer 27, the second upper cladding layer 26, the etching stopper layer 25, the first upper cladding layer 24, the active layer 23, the lower cladding layer 22 and the buffer layer 21 in a region not masked with the resist pattern 30 are removed with a sulfuric acid-based or hydrochloric acid-based etchant.

Figure 7B:
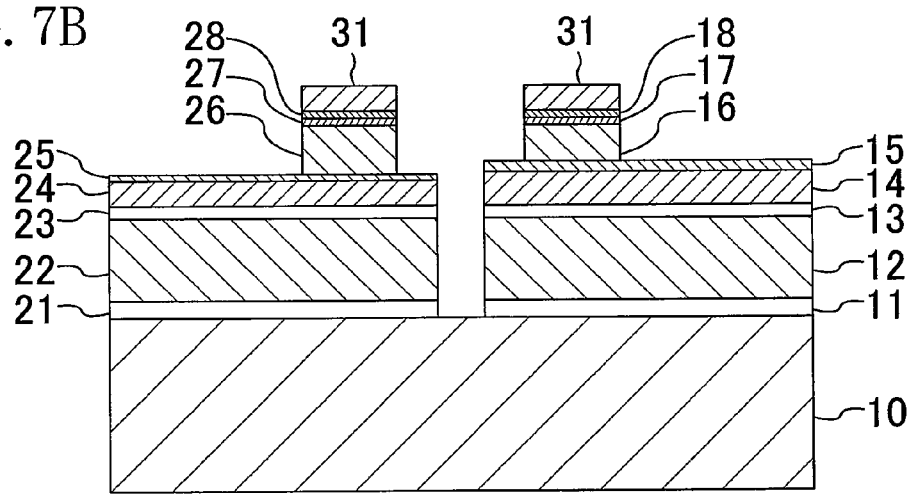

Thereafter, after the resist pattern 30 is removed, as shown in FIG. 7B, a silicon oxide film 31 is deposited by thermal CVD (e.g., at 370° C.) under atmospheric pressure to a thickness of, for example, 0.3 μm over the contact layers 18 and 28. Then, the silicon oxide film 31 is patterned by photolithography and dry etching, thereby forming a mask in the shape of stripes. Subsequently, using the silicon oxide film 31 in the shape of stripes as a mask, the p-type GaAs contact layers 18 and 28, the p-type GaInP protective layers 17 and 27 and the p-type AlGaInP second upper cladding layers 16 and 26 are selectively etched in order. In this manner, mesa ridges are respectively formed in the infrared laser region and the red laser region on the substrate 10 with a hetero structure.

Figure 7C:
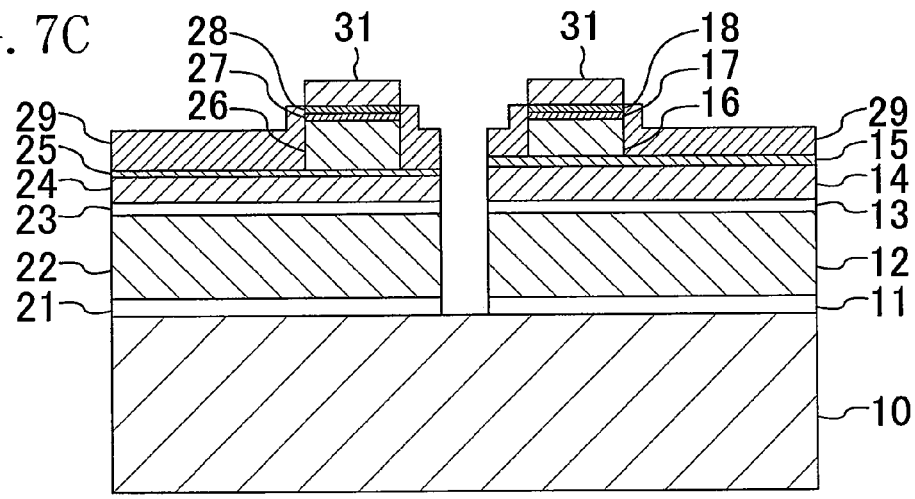

Then, the substrate 10 is placed in the MOCVD reactor or the MBE reactor again. Thereafter, as shown in FIG. 7C, using the silicon oxide film 31 as a mask, an n-type GaAs current blocking layer 29 (with a thickness of 0.7 μm) is selectively grown on the etching stopper layers 15 and 25, the side of the ridge made of the second upper cladding layer 16, the protective layer 17 and the contact layer 18 and the side of the ridge made of the second upper cladding layer 26, the protective layer 27 and the contact layer 28.

Figure 8:
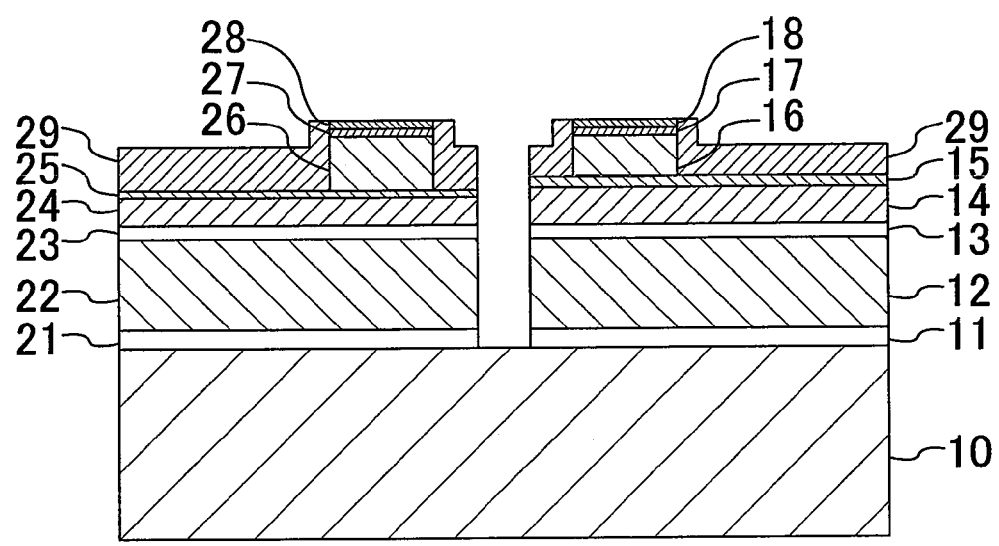
FIG. 8 is a cross-sectional view showing a process step of the method for fabricating a semiconductor laser device according to the embodiment.
Figure 9:
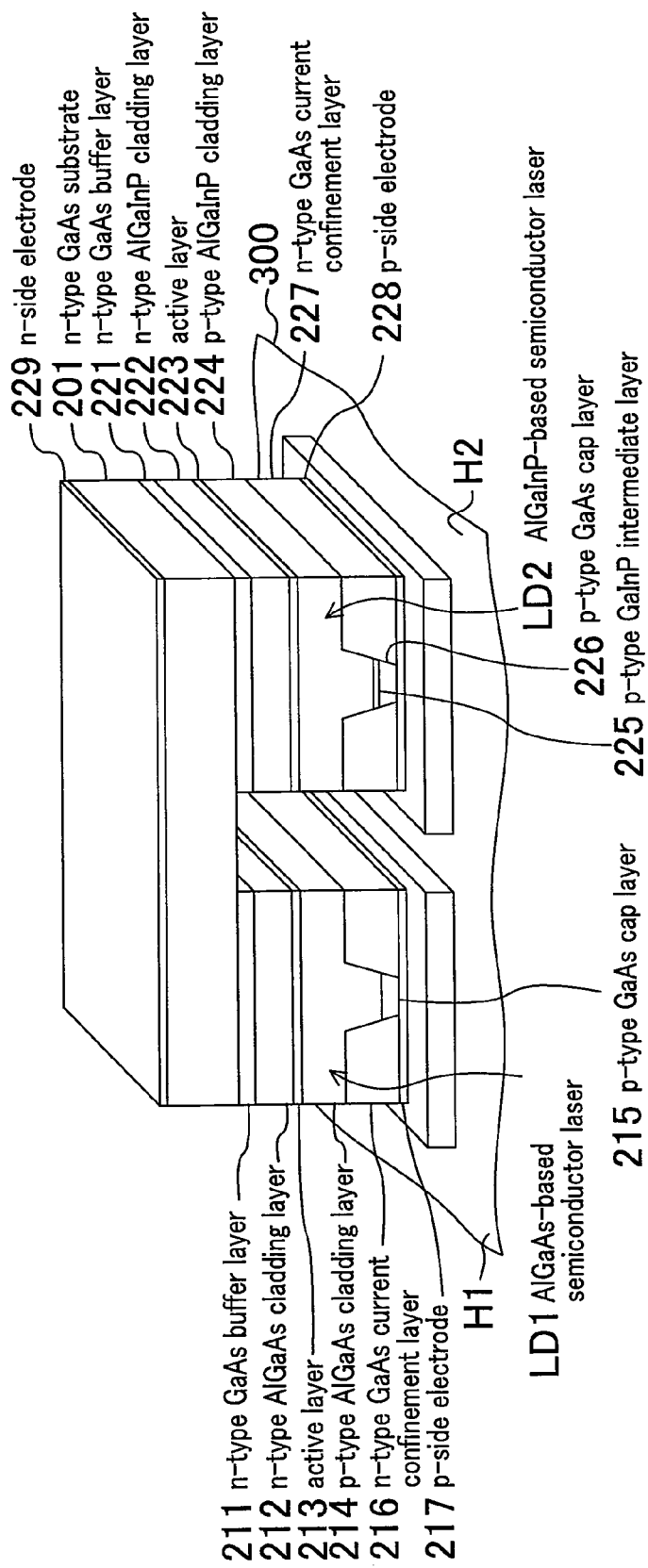
FIG. 9 is a view illustrating a structure of a conventional integrated semiconductor light-emitting device.

Thereafter, the substrate 10 is taken out of the MOCVD reactor or the MBE reactor. Then, as shown in FIG. 8, the silicon oxide film 31 is removed with, for example, a hydrofluoric acid-base etchant. In this manner, a two-wavelength semiconductor laser device according to an embodiment of the present invention is obtained.

As described above, in this embodiment, the thickness of the etching stopper layer for forming the ridge including the upper cladding layer varies among the lasers (light-emitting elements), so that dp (i.e., the distance between the lower surface of the current blocking layer formed on the side of the ridge and the upper surface of the active layer) is allowed to be controlled with a high precision of several tens of Å. Accordingly, $\Delta N$ (i.e., the difference in effective refractive index between the inside and outside of the current injection stripe) is allowed to be controlled on the order of $1 \times 10^{-4}$, so that the shape of light distribution is precisely set. That is, the volume of a saturable absorber formed in the active layer is appropriately set with increase of operation current value due to increase in vertical divergence angle of light distribution and heat saturation of light power during high-temperature operation prevented. As a result, low-noise lasers with a plurality of wavelengths producing self-oscillation are achieved with high reproducibility.

In this embodiment, the two-wavelength semiconductor laser device in the red and infrared regions is described. However, the types (number) and combination of emission wavelengths are not limited. Specifically, though the red laser is used as a light-emitting element which emits light with a relatively short wavelength or a light-emitting element whose threshold-value variation with respect to temperature variation is relatively large. Alternatively, another laser may be used instead. The infrared laser is used as a light-emitting element which emits light with a relatively long wavelength or a light-emitting element whose threshold-value variation with respect to temperature variation is relatively small. Alternatively, another laser may be used.

In this embodiment, materials for the semiconductor layers such as the active layers and the cladding layers and a material for the substrate are not limited. Specifically, $(Al_{0.7}Ga_{0.3})_{0.51}In_{0.49}P$ is used for the n-type lower cladding layer 12 and the p-type first and second upper cladding layers 14 and 16 of the infrared laser. However, materials for the cladding layers 12, 14 and 16 are not limited. The materials for the cladding layers 12, 14 and 16 of the infrared laser are preferably the same as those of the n-type lower cladding layer 22 and the p-type first and second upper cladding layers 24 and 26 of the red laser. If $(Al_{0.7}Ga_{0.3})_{0.51}In_{0.49}P$ is used for these cladding layers, operation current at high temperatures (e.g., 85° C.) is reduced, as compared to the case of using AlGaAs containing AlAs, for example. If the same material is used for the ridges (i.e., the second upper cladding layers 16 and 26) of the red laser and the infrared laser, these ridges are allowed to be formed at a time by etching, thus enhancing productivity.

In this embodiment, the etching stopper layers of the lasers are preferably made of multiple quantum well structures. This prevents dissipation of current flowing through the etching stopper layer, i.e., reactive current.

In this embodiment, the same semiconductor layer is preferably formed on the sides of the ridges of the lasers. This makes it possible to form light confinement layers (current blocking layers) on the sides of the ridges by the same crystal growth process. Accordingly, the number of crystal growth is reduced, thus simplifying element fabrication processes. In this case, the semiconductor layer is preferably a current blocking layer of AlInP or GaAs. Specifically, if the semiconductor layer is a current blocking layer of AlInP, effective refractive-index waveguide mechanisms are obtained in the infrared laser and the red laser whose cladding layers are made of an AlGaInP-based material, so that operation current values and oscillation threshold current values of the semiconductor lasers are reduced. If the semiconductor layer is a current blocking layer of GaAs, refractive index waveguide mechanisms are obtained in the multiple-wavelength semiconductor laser device, thus enabling stable fundamental transverse mode oscillation.

In this embodiment, instead of the semiconductor layer, a dielectric layer may be formed on the sides of the ridges of the lasers. This allows effective refractive-index waveguide mechanisms to be achieved in the multiple-wavelength semiconductor laser device, thus reducing operation current values and oscillation threshold current values of semiconductor lasers. In this case, the dielectric layer may be one of, or a stack of two or more of, a SiN layer, a $SiO_2$ layer, a $TiO_2$ layer and an $Al_2O_3$ layer. The dielectric layer may also be made of mixed crystal made of two or more of SiN, $SiO_2$, $TiO_2$ and $Al_2O_3$. Specifically, if the dielectric layer is a current blocking layer of $SiO_2$, current injected into the active layer is concentrated in a portion of the active layer located under the ridge, so that carrier population inversion necessary for laser oscillation is achieved by a smaller amount of injected current. In addition, since the current blocking layer of the dielectric layer is transparent, losses inside the lasers are reduced, so that the thickness dp1 of the first upper cladding layer 14 in the infrared laser and the thickness dp2 of the first upper cladding layer 24 in the red laser are set at larger values. That is, if the current blocking layer of the dielectric layer is formed on the side of the ridge in each of the lasers, the difference between the thickness dp2 of the first upper cladding layer 24 in the red laser and the thickness dp1 of the first upper cladding layer 14 in the infrared laser is set at a lager value.

In this embodiment, instead of the semiconductor layer, a polycrystalline layer or an amorphous layer may be formed on the side of the ridge in each laser. Then, current injected into the active layer is concentrated in a portion of the active layer located under the ridge, so that carrier population inversion necessary for laser oscillation is achieved by a smaller amount of injected current. If a current blocking layer of a polycrystalline or amorphous layer is formed on the side of the ridge in each laser, light outside the ridge (i.e., light outside the stripe) in laser light of each of the red laser and the infrared laser is absorbed. Accordingly, even when the thickness dp1 of the first upper cladding layer 14 in the infrared laser and the thickness dp2 of the first upper cladding layer 24 in the red laser are set at larger values, transverse mode oscillation is stabilized, thus enhancing a multi-mode characteristic. That is, the structure using a current blocking layer of a polycrystalline layer enables the difference between the thickness dp2 of the first upper cladding layer 24 in the red laser and the thickness dp1 of the first upper cladding layer 14 in the infrared laser to be set at a larger value. In addition, a light confinement layer (i.e., a current blocking layer) is allowed to be formed on the ridge side by depositing a polycrystalline or amorphous layer without using a method with in which the current blocking layer is deposited on the ridge side with crystal growth apparatus. Accordingly, element fabrication processes are simplified. The polycrystalline layer may be a poly-Si layer and the amorphous layer may be one of, or a stack of two or more of, an amorphous Si layer, an amorphous Ge layer and an amorphous SiGe layer. Instead of the polycrystalline layer or the amorphous layer, a layer of mixed crystal made of two or more of amorphous Si, amorphous Ge, amorphous SiGe and poly-Si may be used. Then, refractive-index waveguide mechanisms are achieved in a multiple-wavelength semiconductor laser device, thus enabling stable fundamental transverse mode oscillation.

What is claimed is:

1. A method for fabricating a semiconductor laser device including a substrate and a plurality of light-emitting elements, the light-emitting elements emitting light with different wavelengths and integrated on the substrate, the light-emitting elements including a red laser and an infrared laser, each of the red laser and the infrared laser including a lower cladding layer, an active layer, a first upper cladding layer, an etching stopper layer and a second upper cladding layer on the substrate, the second upper cladding layer of each of the red laser and the infrared laser having a mesa ridge portion, each of the first upper cladding layer and the second upper cladding layer of each of the red laser and the infrared laser being made of an AlGaJnP-based material, the etching stopper layer of each of the red laser and the infrared laser being made of an InGaP-based material, the etching stopper layer of the infrared laser having a thickness larger than that of the etching stopper layer of the red laser, the method comprising the steps of:

forming the lower cladding layer, the active layer, the first upper cladding layer, the etching stopper layer and the second upper cladding layer in this order on the substrate in a region of each of the red laser and the infrared laser; and patterning the second upper cladding layer of each of the red laser and the infrared laser into a mesa shape at the same time, thereby forming a ridge portion;

wherein the thickness of the etching stopper layer varies among the light-emitting elements.

2. A method for fabricating a semiconductor laser device according to claim 1, wherein the distance from an upper surface of the active layer of the infrared laser to an upper end of the ridge portion of the infrared laser is the same as the distance from an upper surface of the active layer of the red laser to an upper end of the ridge portion of the red laser.

* * * * *